(12) United States Patent
Moizer

(10) Patent No.: US 6,678,156 B2
(45) Date of Patent: Jan. 13, 2004

(54) COOLING OF ELECTRONIC EQUIPMENT ENCLOSED WITHIN A SECURITY CABINET

(75) Inventor: William J. Moizer, Nepean (CA)

(73) Assignee: Alcatel Canada Inc., Ottawa (CA)

( * ) Notice: Subject to any disclaimer, the term of this patent is extended or adjusted under 35 U.S.C. 154(b) by 0 days.

(21) Appl. No.: 10/200,249

(22) Filed: Jul. 23, 2002

(65) Prior Publication Data

US 2003/0081381 A1 May 1, 2003

(30) Foreign Application Priority Data

Oct. 25, 2001 (CA) .............................................. 2360023

(51) Int. Cl.[7] ................................................. H05K 7/20
(52) U.S. Cl. ........................ 361/690; 361/694; 361/695; 312/236; 454/184
(58) Field of Search ................................. 361/689, 690, 361/692–696, 724; 174/16.1, 16.3, 15.1, 252; 165/80.3, 104.33, 122; 454/184

(56) References Cited

U.S. PATENT DOCUMENTS 4,644,443 A * 2/1987 Swensen et al. ............ 361/687
5,559,673 A * 9/1996 Gagnon et al. ............. 361/695
5,801,632 A * 9/1998 Opal ........................... 340/585
6,094,346 A * 7/2000 Schweers et al. ........... 361/695
6,104,003 A * 8/2000 Jones ......................... 219/400
6,144,555 A * 11/2000 Turunen ..................... 361/690
6,330,152 B1 * 12/2001 Vos et al. ................... 361/688
6,459,579 B1 * 10/2002 Farmer et al. .............. 361/695

* cited by examiner

Primary Examiner—Boris Chervinsky
(74) Attorney, Agent, or Firm—Jim Zegeer

(57) ABSTRACT

A combination of a security cabinet and electronic equipment housed with the security cabinet in which cooling air is passed directly from outside the cabinet into the equipment so as to bypass air within a chamber of the cabinet. Preferably, a conduit is provided which extends between a wall of the cabinet to the equipment to introduce the cooling air from ambient atmosphere into the equipment. A method is also provided for introducing cooling air directly from outside the cabinet into the equipment. The method and combination enable lower operating temperatures of electronic equipment to be maintained than is possible with existing equipment housed in security cabinets.

16 Claims, 4 Drawing Sheets

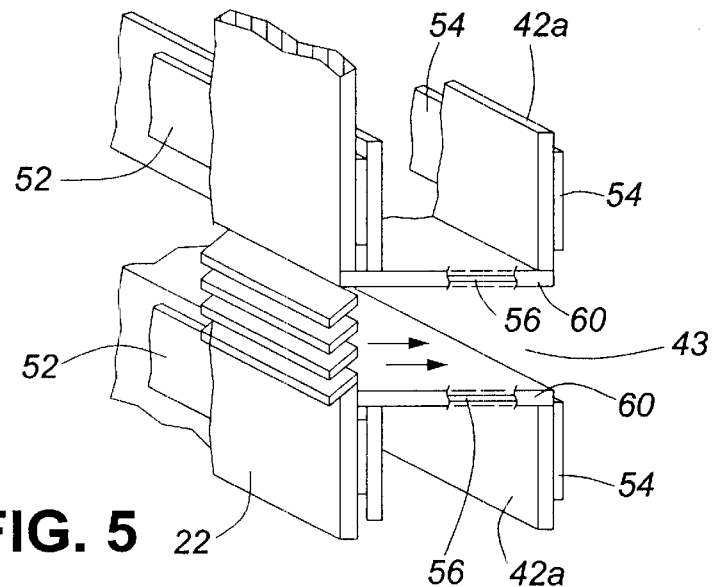
FIG. 5
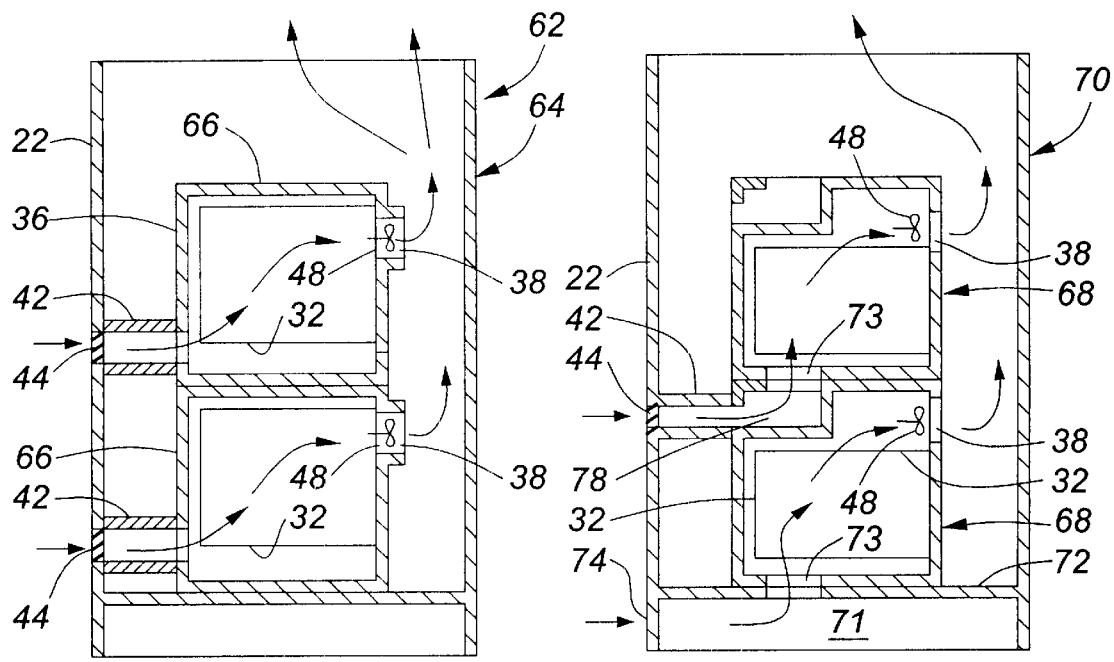
FIG. 6  FIG. 7

COOLING OF ELECTRONIC EQUIPMENT ENCLOSED WITHIN A SECURITY CABINET

FIELD OF THE INVENTION

This invention relates to the cooling of electronic equipment enclosed within a security cabinet.

BACKGROUND OF THE INVENTION

As a result of global deregulation of the telecommunications industry, telecommunication service providers are obliged to allow access to their competitors into their central offices. There is a growing practice to locate telecommunications equipment from competing vendors in a common office area and, in consequence, security of their equipment and integrity of their telecommunication services are of serious concern to service providers. It is possible that the integrity of unsecured equipment may be inadvertently disrupted by unauthorized craftsmen during the performance of their work function in a common office area. For this reason, security cabinets are now being used, on an increasingly widespread basis, to house telecommunication equipment, e.g. in central offices. There is a wide variety of telecommunications equipment that must be secured to ensure operational integrity. This includes central office equipment, switches, routers and mobile switching centers. In addition, it may be found prudent or necessary for various reasons to house electronic equipment, other than telecommunications equipment, within security cabinets. Such other electronic equipment may include electronic control or operating mechanisms as used in industry.

During use, electronic equipment is known to generate heat. Unfortunately, operational components, such as surface mount components, e.g. integrated circuit components, of electronic equipment, operate correctly only when their operational temperatures are maintained below certain limits. Above such temperatures, incorrect component operation is known to result, thereby causing either incorrect operation of the equipment or its complete breakdown or premature failure. Hence, it is essential to remove heat and heat removal includes passing cooling air through the equipment for heat extraction.

In published descriptions of electronic equipment housed within security cabinets, such as in published Patent Applications, for example WO 00/21372 and AU 9183401, cooling air passes along interconnected in-series pathways, i.e. from ambient atmosphere into a cabinet chamber, from the cabinet chamber through the equipment and then back into the cabinet chamber before being forced as heated air back outside the cabinet. A problem with this published type of cooling is that it is known that the presence of the cabinet deleteriously affects the efficiency of the cooling process. A reason for this is that the air temperature within the cabinet chamber is raised by the heated air issuing into it from the electronic equipment and also by heat radiation and heat conduction from the equipment into the chamber. Hence, while the chamber temperature ranges are lower than those within the equipment, the heated air within the chamber acts to heat insulate the equipment from the ambient atmosphere. Thus heat is not extracted from the electronic equipment at such an advantageous rate as would be the case without the use of a security cabinet.

Generally speaking, electronic equipment designed for central office telecommunications applications may operate correctly and efficiently within a normal temperature range e.g. of between 5 and 40 degrees centigrade. However, when housed within security cabinets, the operating temperature of any electronic equipment will increase, and there is a potential danger of sufficiently high temperatures developing to harm the equipment. Five or more years ago, a single unit of electronic equipment, such as telecommunications equipment, may have been operating at 500 watts of power. Cooling methods at that time adequately dealt with sufficient heat extraction to easily maintain operating temperatures within the required normal range. Even when multiple units of equipment were housed together, excessive power was not used, e.g. three units required only about 1.5 kW of power, and temperature control was again easily maintained. However, as further development has taken place, circuitry has become more complex and dense upon printed circuit boards and with the use of more closely packed and great numbers of circuitry components, a single unit of electronic equipment is now operating at 4 kW of power. This is well beyond that required for the three previous units referred to above. It is also now known to use two units together, each requiring 4 kW of power with a resultant 8 kW of power.

As may be seen therefore, over about the last five years it has become progressively more difficult to extract heat from electronic equipment at sufficiently high rates to maintain operating conditions within the desired operating range of temperatures. The use of security cabinets has increased this difficulty because of the heat insulating effect provided by them. For instance, with the recently designed high powered equipment, operating temperatures within a security cabinet chamber may be extremely high, e.g. 15 degrees centigrade or higher, compared to room temperature. This leads to extremely high operating temperatures within the equipment, e.g. 15 degrees centigrade higher than would be the case without the use of a security cabinet. With a required highest operational temperature being 40 degrees centigrade, for example, it may be seen that such a temperature may easily be exceeded when the more recently designed equipment is installed within security cabinets.

In efforts to overcome the above practical cooling problems, some vendors of electronic equipment and security cabinets have advocated placing heat exchangers or air conditioners inside cabinets. The addition of such further equipment requires significant infrastructure costs to the installer and high risks of costly damage to electronic equipment in the event of cooling equipment failure or of leakage of fluids used by heat exchangers and air conditioners. Understandably, telecommunications service providers are often unwilling to deal with the additional cost, risk, and complexity of adding this additional equipment to their installations. For these reasons also, telecommunications service users wish to avoid heat exchangers or air conditioners inside cabinets.

In addition, suggestions have been put forward to create specific pathways for cooling air through chambers of security cabinets on the cooling air inlet and output sides of electronic equipment. This is for the intended purpose of avoiding heat buildup in cabinet chambers. When put into practice, however, the structures have been ineffective in eliminating the heat extraction problem. In one of these structures, electronic equipment is housed within a cabinet having its chamber separated by partitions into an air intake side and an air outlet side. Cooling air received into the air intake side of the chamber is caused to flow through the equipment to be exhausted into the air outlet side of the chamber before dissipation into ambient atmosphere. However, apart from having no noticeable effect on the heating problem, the structure is of undue complexity and requires the installer to mount the partitions to extend from walls of the cabinet to the equipment while being sealed in position. This presents added assembly problems.

As may be seen therefore, the above-related problems, while extremely important to solve in the light of present and advancing technology, have up to this present time, not been successfully addressed.

SUMMARY OF THE INVENTION

The present invention seeks to provide a structure for cooling electronic equipment within a security cabinet and a method of cooling which eliminates or diminishes the above problems.

According to one aspect of the present invention, there is provided a combination of a security cabinet and electronic equipment housed within the security cabinet, a cooling air flow passage arrangement for the electronic equipment, and an inlet and an outlet for the cooling air flow passage arrangement, and in which the inlet opens directly to the exterior of the cabinet to pass cooling air directly from a first spacial region, exterior to the cabinet, into the air flow passage arrangement, while substantially bypassing a chamber between the cabinet and the electronic equipment, to be expelled from the outlet and outwardly of the cabinet to a second spacial region exterior to the cabinet.

In use, the air entering the cooling air flow passage arrangement (referred to hereinafter in the description as "cooling passage arrangement") directly from the spacial region is substantially at ambient atmospheric temperature, i.e. that outside the confines of the cabinet. Hence, this air is substantially unaffected by higher air temperatures within the cabinet chamber. Because the air entering the cooling passage arrangement is at substantially ambient temperature, it removes heated air from within the electronic equipment more effectively than would be possible if cooling air entered that arrangement entirely from the cabinet chamber, as this latter air is at a higher temperature than the ambient temperature.

In a preferred structure, all of the cooling air is drawn from the ambient atmosphere, i.e. while completely preventing any cooling air from entering the electronic equipment from the cabinet chamber. Hence, most effective cooling will occur with this preferred structure. In other structures consistent with maintaining operating temperatures within the electronic equipment within required limits, the inlet is provided to deliver a certain percentage of the cooling air to the cooling passage arrangement directly from the first spacial region, while other cooling air, which is warmer than that from the first spacial region, is introduced from the cabinet chamber. The resultant mixture of cooling air from both of these sources has a temperature lower than that of the air in the cabinet chamber alone. It follows that the resultant mixture will be more efficient in removing heat from the electronic equipment than cooling air entering from the cabinet chamber only. Therefore, while the preferred structure referred to above provides an optimal heat removal rate from the equipment, it is to be understood that the invention includes structures in which a certain percentage of cooling air is drawn also from the cabinet chamber with the proviso that the temperatures within the equipment are maintained below their desired upper operational limits.

In addition, equipment, in combinations according to the invention, conveys less heat from its walls into the air of the chambers of security cabinets, than is possible with prior constructions using security cabinets. Hence, temperatures within the whole of a cabinet and electronic equipment combination are maintained lower than has previously been possible.

Different practical structures are possible within the scope of the invention. In some practical structures, the inlet to the cooling passage arrangement is provided in a wall of the cabinet and a cooling air conduit extends from the inlet, across part of the chamber of the cabinet, to the electronic equipment. This conduit defines a first part of the cooling passage arrangement which is interconnected to a second part of the arrangement defined with the electronic equipment itself. Preferably, this conduit is substantially sealed so as to seal the air of the first part of the cooling passage arrangement from the chamber of the cabinet.

In a preferred construction using a conduit, the inlet is provided in a door arrangement of the cabinet. In practice, it may be convenient to provide the door arrangement in the form of two doors which are hinged at remote edges of the door arrangement with free edges of the doors being close together to form the wall when in closed positions. This results in the cooling air conduit being provided in two portions. The two portions are mounted one to each door to define part of the inlet in each door, and with the two portions having surfaces which, with the doors closed, oppose each other to form the conduit.

In another preferred structure, the cooling passage arrangement has a first portion extending beneath the equipment and a second portion within the electronic equipment and opening on to the first portion at an underside of the equipment. The inlet is provided in a lower portion of a wall of the cabinet to direct cooling air beneath the underside of the electronic equipment and through the passage arrangement.

The invention also includes a method of cooling electronic equipment housed within a security cabinet comprising moving a stream of cooling air directly from a first spacial region exterior to the cabinet into and through a cooling passage arrangement of the electronic equipment, while substantially bypassing a chamber defined between the cabinet and the electronic equipment, and then passing the stream of cooling air into a second spacial region exterior to the cabinet.

BRIEF DESCRIPTION OF THE DRAWINGS

Embodiments of the invention will now be described by way of example, with reference to the accompanying drawings, in which:

FIG. 5 is a scrap isometric view taken in the direction of arrow V in FIG. 4 of part of the combination of the first embodiment;

FIGS. 6, 7, 8 and 9 are views similar to FIG. 1 of second to fifth embodiments of the invention.

DESCRIPTION OF PREFERRED EMBODIMENTS

Figure 1:
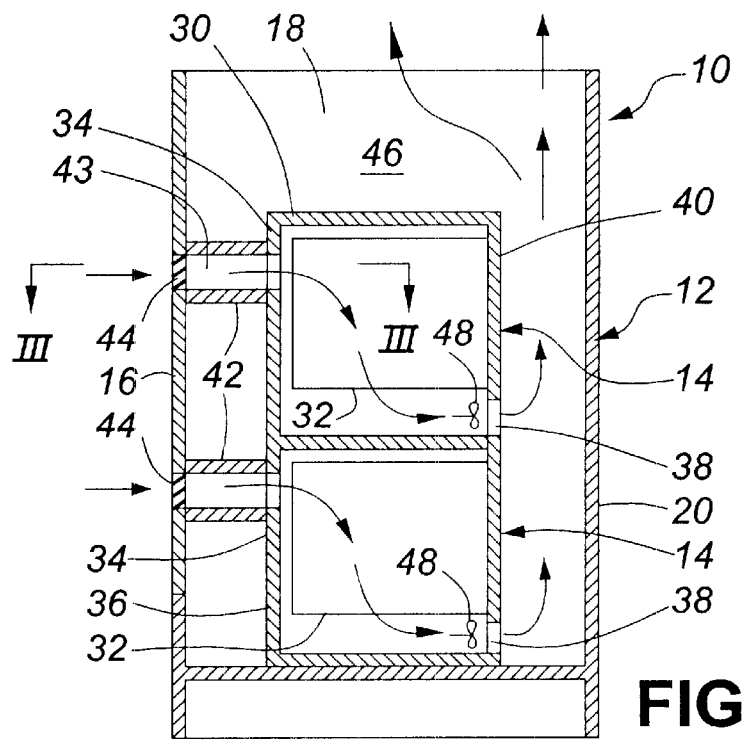
FIG. 1 is a vertical cross-sectional view, shown diagrammatically, of a combination of the invention according to a first embodiment.

As shown by FIG. 1, in a telecommunications installation, a combination 10 comprises a security cabinet 12 and two units 14 of electronic equipment, i.e. telecommunications equipment, the units 14 being identical and supported one above another.

Figure 2:
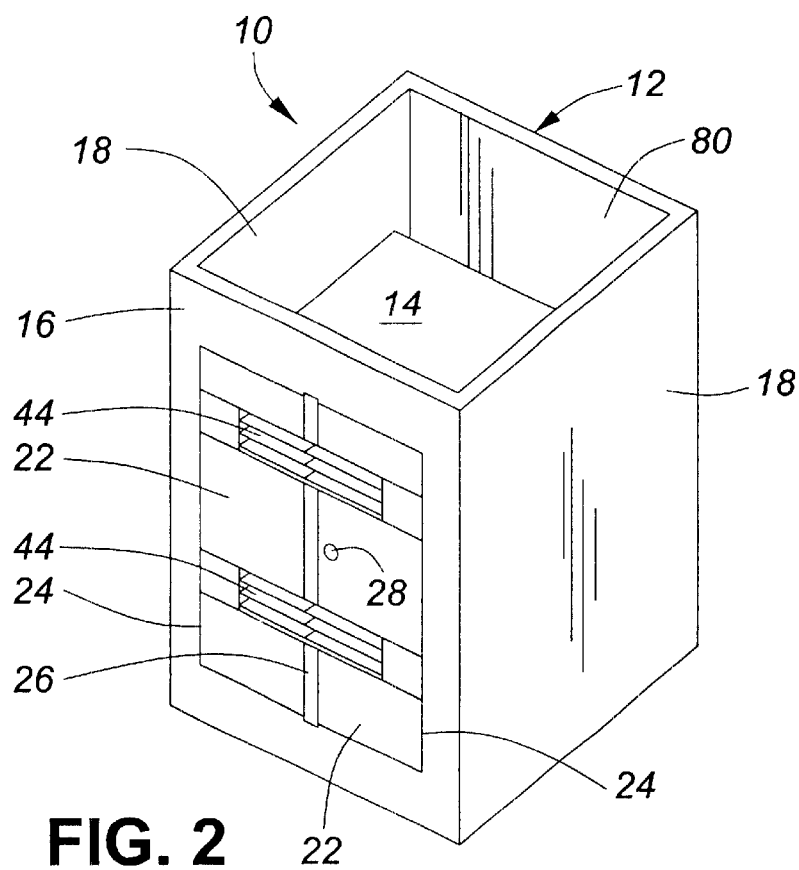
FIG. 2 is a front isometric view taken from the outside of the combination.

As shown by FIG. 2, the cabinet has a front wall 16, two side walls 18 and a rear wall 20 to form in plan view a substantially square structure. The front wall 16 comprises a door arrangement having two doors 22, the doors being hinged at remote edges 24 and having free edges 26 which close together into the form of the wall. A security lock 28 is used to normally secure the doors in a closed position.

Each of the units 14 comprises a housing 30 within which are disposed a plurality of vertical printed circuit boards 32, conventionally arranged in horizontally side by side manner and forming part of electronic circuitry of the unit. For each unit 14, a cooling air conduit 42 extends across part of a chamber 46 of the cabinet, between the front wall 16 of the cabinet and a front wall of the housing 30.

Figure 3:
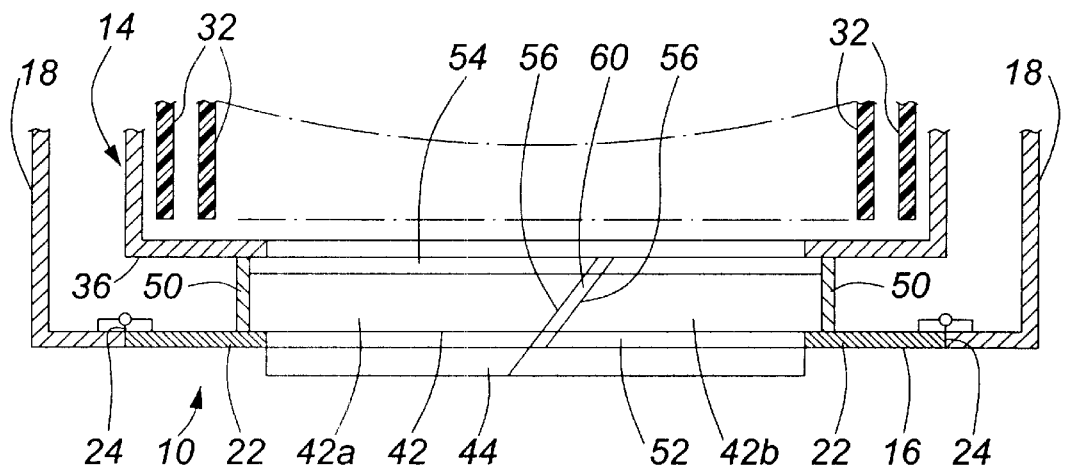
FIGS. 3, and 4 are cross-sectonal views, to much larger scale, taken along line III—III in FIG. 1, and showing different positions of parts of the combination of the first embodiment.
Figure 4:
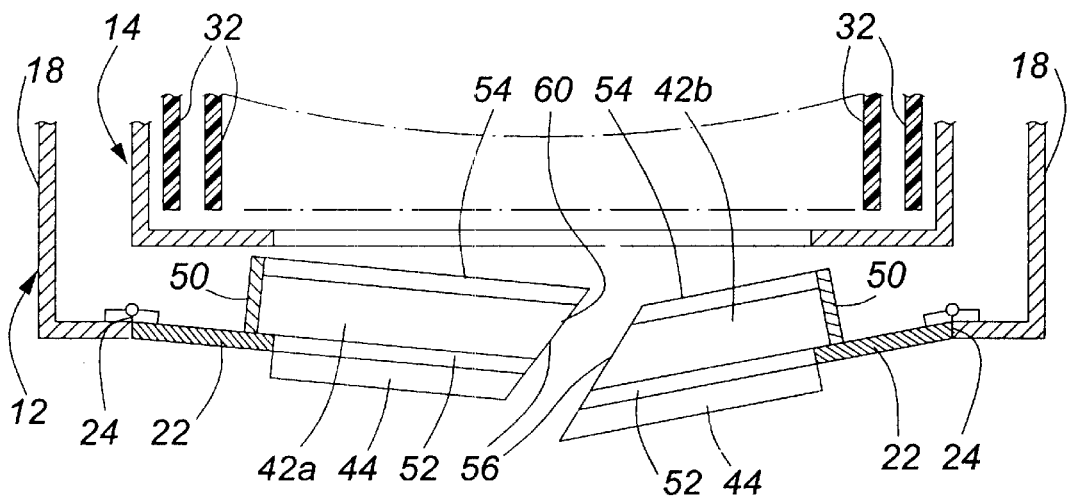

As may be seen more clearly from FIGS. 2 to 4, a louvered inlet 44, for cooling air into the conduit 42 from ambient atmosphere in the central office, is provided partly by each of the doors 22. Alternatively, not shown, louvers are not provided by the doors, but are provided by the front wall of the housing 30. The doors in their closed positions form the complete inlet, as shown by FIGS. 2 and 3. The conduit 42 is thus a first part of the cooling passage arrangement which is interconnected in series to a second part of the arrangement within its associated unit 14 of electronic equipment. The second part of the cooling passage arrangement commences at an upper part 34 of the front wall 36 of housing 30 and extends to an outlet 38 at a lower region of rear wall 40. The direction of cooling air flow for each of the units 14 is shown by arrows in FIG. 1. The outlets 38 open directly into a chamber 46 of the security cabinet and within which the units 14 are accommodated. The cooling air after heating passes through the outlets 38 into the chamber and flows upwardly, as also shown by the arrows, directly outwards through a completely open top of the cabinet or through a suitably sized opening (not shown) in the top. The cooling air is driven through the cooling passage arrangement in normal fashion for cooling electronic equipment by strategically placed fans 48, within each unit.

An essence of the invention is that the units 14 of electronic equipment are provided with their cooling air directly from outside the confines of the cabinet so as to be disassociated from air within the cabinet chamber. With the first embodiment, the conduit 42 for each unit is an essential requirement in this respect as it draws air from ambient atmosphere within the central office surrounding the cabinet. Each of the conduits 42 is of a specific construction. Each conduit is rectangular in section so as to present its air passage 43 (FIGS. 1 and 5) in alignment directly with the inlet 44 provided by the doors 22 and to conform to the entrance to the second portion of the cooling passage arrangement within the associated unit 14. As shown particularly by FIGS. 3 and 4, each conduit is formed of two portions 42a and 42b which are carried, one portion by each door 22. Each conduit portion has short side walls 50 to extend between the doors 22 and the front wall 36 of its associated unit 14. At each flanged end, i.e. in the direction of flow of cooling air, of each of the portions 42a and 42b, there is provided a front and rear seal 52 and 54. The front seal 52 permanently seals the front flanged end of the conduit portion 42a or 42b to its respective door, because the conduit portions are secured to the doors. The rear seals 54 are provided to seal against the front wall 36 of its unit 14 only when the doors are in closed positions, as shown by FIGS. 2 and 3.

The conduit portions 42a and 42b have upper surfaces which oppose each other and lower surfaces which oppose each other, opposing surfaces being sealed together when the doors are in closed positions. As shown by FIGS. 3, 4 and 5, the upper and lower surfaces 56 of the conduit portions 42a and 42b are inclined relative to the plane of the doors when the doors are in closed positions. The upper and lower surfaces 56 of the conduit portion 42a, i.e. on the left hand door shown in FIGS. 3 and 4, are inclined to face forwardly of the combination 10, whereas the upper and lower surfaces 56 on the right hand door are inclined at the same angle rearwardly. Hence, the left hand door needs to be moved into a closed position, e.g. from the position of FIG. 4 to that of FIG. 3, before the right hand door is moved into its closed position, so as to bring opposing surfaces 56 into closed positions. The end of the conduit portion 42a, i.e. at surfaces 56, is provided with compressible seals 60 which seal between the surfaces 56 of the conduit portions with the doors in closed positions. With the doors in closed positions, as shown by FIGS. 2 and 3, the seals 52, 54 and 60, cooperate to substantially completely seal cooling air passing through the passage 43 of each conduit 42 from comparably warmer air of the chamber 46.

Because of the locations of the conduit portions 42a and 42b upon the doors 22, the units 14 of equipment may be units normally used without security cabinets and in unmodified form to provide a structural combination within the scope of the invention. Hence, it is merely necessary to provide the security cabinet with the required shape and size of the inlet 44 for each of the units 14 and with each of the conduits held by the doors and designed to align the inlets 44 with the entrances to the second portions of the cooling passage arrangements of the units.

In use, cooling air is drawn by the fans 48 into the cooling passage arrangements of the units directly from the ambient atmosphere, i.e. exterior to the security cabinet 12. This air is at ambient temperature, as is normal for equipment when not employing a security cabinet. Hence, with the use of a security cabinet, as in this embodiment, the cooling air is at its lowest temperature obtainable for cooling purposes. The fans 48 effectively serve the purpose of drawing the air through the inlets 44, through the conduits 42 and through equipment and out through the chamber 46, while serving also to disturb the air within the chamber for heat extraction purposes.

As may be seen from the first embodiment, any increase in temperature of the incoming ambient air along the air passage 43 of each conduit 42, may be caused only through heat transfer through the conduit walls from the heat of the air in the cabinet chamber. However, as the air in the conduit is travelling only along the short distance of the conduit before reaching its unit 14, any temperature increase within the conduit may be so slight as to be negligible. Hence, the cooling air temperature as the air flows into each unit 14 of equipment, may be favorably compared to cooling air temperatures entering the equipment if it were to be used without being confined within a security cabinet. Certainly the cooling air temperatures in the first embodiment are markedly lower than would be conventionally found with use of the equipment within a security cabinet, and in which its cooling air is drawn directly from within the cabinet itself, as distinct from outside the cabinet and bypassing air within the cabinet chamber. As a result, in the embodiment, operating temperatures within the electronic equipment are maintained within a required operating temperature range (e.g. below 40 degrees C.), to ensure correct operation of the equipment without any incorrect operation or failure being caused by high temperature situations. This is found to be the case even though the air temperature within the chamber 46 and surrounding the equipment is higher than ambient temperatures. Thus, the passive cooling system of the embodiment provides satisfactory results without the need for additional air conditions or heat exchangers and while the operational temperatures of the electronic equipment are not compromised. Also, leakage of fluids from such additional equipment is therefore avoided, together with any risk of equipment failure resulting therefrom.

The resistance to flow of heated air being exhausted from the security cabinet is extremely low because of its open top construction. Hence, no air driving force, such as fans, is required by the cabinet for this purpose. Thus the cost of the cabinet and its maintenance are minimized and any risk of heat buildup resulting in thermal shutdown due to cabinet fan failure is eliminated. In this embodiment, the air is drawn in to the equipment and driven out from the equipment and from the cabinet by the fans employed in each unit 14 of electronic equipment.

Because of the direct use of ambient air for cooling, the electronic equipment of the embodiment may be of a structure designed normally for use without a security cabinet and does not require any modification when used within the cabinet. Hence, the invention makes it possible to enable equipment vendors to provide the same equipment for use either with or without security cabinet.

Since there are no active components forming part of the cabinet of the first embodiment, any regulatory approval process for the electronic equipment in combination with a cabinet is minimized, thereby allowing for its rapid deployment both to domestic and world markets.

Further embodiments of the invention now to be described offer the same advantages discussed above for the first embodiment. Also, in these later embodiments the same reference numerals are used for parts identical or similar to those discussed in the first embodiment.

In a combination 62 of a second embodiment, a security cabinet 64 is provided within which are two units 66 of electronic equipment mounted one above the other, as shown by FIG. 6. In the second embodiment, the units 66 differ from those of the first embodiment in that entrances to second parts of the cooling passage arrangements of the units are disposed in a lower portion of the front walls 36 of the units, while the outlets 38 for air are disposed at upper portions of the rear walls 40. One or more fans 48 is positioned adjacent to each outlet 38 for driving cooling air through the cooling passage arrangement of each unit. Each unit 66 also incorporates a conduit 42 of the structure described in the first embodiment and which provides a first part of its cooling passage arrangement. Because the positions of the conduits 42 are lower than those described in the first embodiment, then the inlets 44 to the cooling passage arrangements are lower in the door arrangement (i.e. the doors 22) of the security cabinet than in the first embodiment. The security cabinet is otherwise of similar construction to the cabinet 12 of the first embodiment. The cooling air flow paths through the units 66 are shown by the arrows in FIG. 6.

In a third embodiment, as shown by FIG. 7, two identical units 68 of electronic equipment are located one above another within a security cabinet 70. The lower unit 68 has a cooling passage arrangement which includes a first part provided in an area 71 beneath a floor 72 of the cabinet with a louvered inlet 74 for cooling air being disposed in the lower regions of the front wall of the cabinet and beneath the door arrangement. The cooling passage arrangement also includes a second part within the lower unit 68 and which has an entrance 73 at the underside of the unit to connect it to the first part of the passage arrangement. An outlet 38 in an upper region of the lower unit is provided with at least one fan 48 for drawing the air through the inlet, beneath the floor 72, through the lower unit 68, and then through the outlet 38 into the open topped security cabinet 70.

The upper unit 68 also has an entrance 73 on its underside to interconnect a second part of the cooling passage arrangement within the unit with a first part which is provided partly by an upper region 78 of the lower unit 68. With this structure, only one conduit 42 is required, i.e. that needed to complete the first part of the cooling passage arrangement of the upper unit 68. This conduit extends between the door arrangement of the cabinet and the lower unit 68 and at least one fan draws ambient air at room temperature through the first and second parts of the passage arrangement and through the outlet 38.

The cabinet 70 is of the construction described for the security cabinet 12 of the first embodiment, except that it has a single inlet 44 for the single conduit 42, as described in the third embodiment, and also it has the inlet 74 at the lower portion of the front wall.

Figure 8:
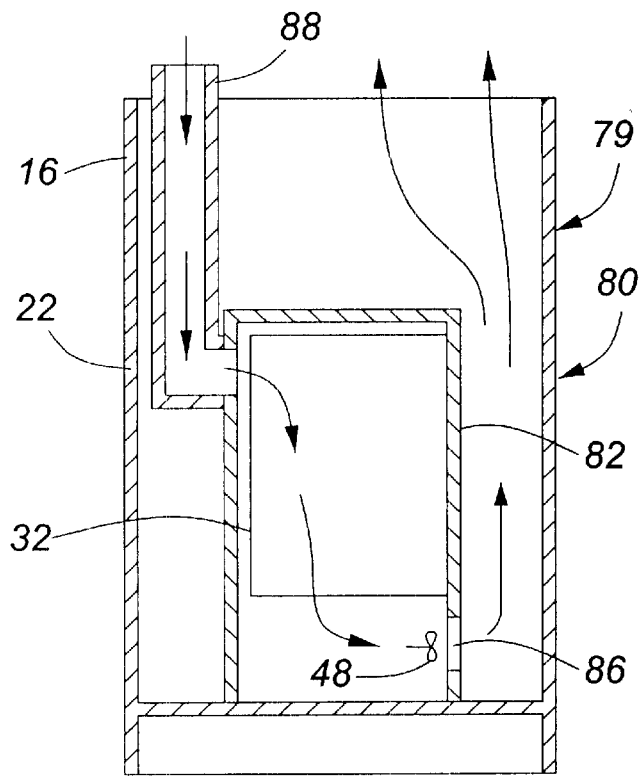

In a fourth embodiment, with reference to FIG. 8, in a combination 79, a security cabinet 80 is of the structure described for the cabinet 12 of the first embodiment except that no inlets for cooling air are provided either in the doors 22 of the cabinet or in any other wall for incoming air.

In the combination 79, a single unit 82 of electronic equipment is located within the cabinet 80 and a second part of the cooling passage arrangement within the unit 82 has an entrance in an upper region of the cabinet and an outlet 86 from the arrangement is disposed in a lower region of the rear wall, together with at least one driving fan 48. The cooling air flow passage arrangement for the unit 82 includes a first portion provided by a conduit 88 which extends vertically upwards behind the front wall 16 of the cabinet so as to draw incoming air from outside the cabinet from a position above the cabinet. The direction of air flow through the equipment and out from the cabinet is shown in FIG. 8 for this embodiment.

Figure 9:
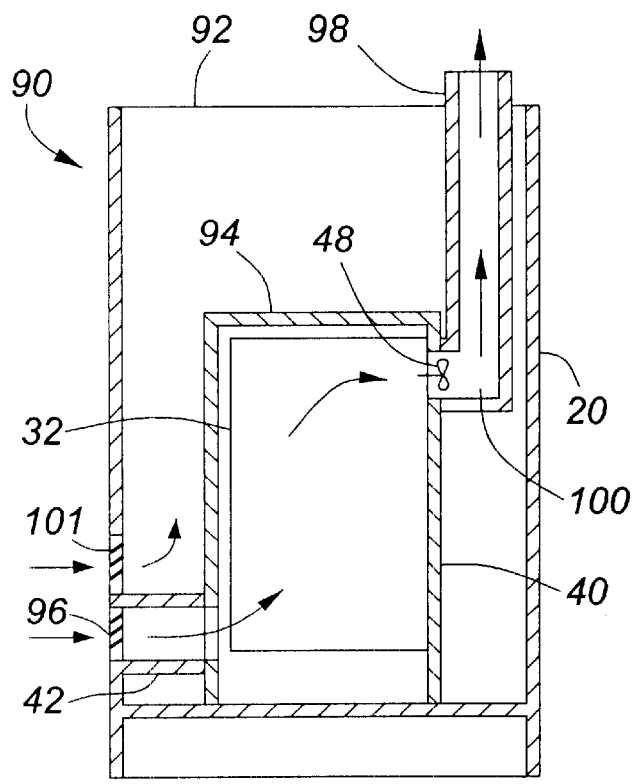

In a fifth embodiment (FIG. 9), a combination 90 comprises a security cabinet 92 having a single unit 94 of electronic equipment within it. This equipment is served by a conduit 42 for incoming air in a lower region of the unit 94, thereby requiring an inlet 96 in a lower portion of the front wall of the cabinet. An outlet for cooling air from the equipment comprises a vertical conduit 98 extending between the rear wall 20 of the cabinet and the rear wall 40 of the unit 94, the conduit 98 extending from a rear outlet 100 for air in an upper region of the unit 94 to a position above the cabinet. The direction of cooling air flow for the fifth embodiment is shown by the arrows in FIG. 9. A vent 10 may be provided in a lower region of the doors 22 to encourage upward movement of air within the chamber 46 by natural convection.

Figure 10:
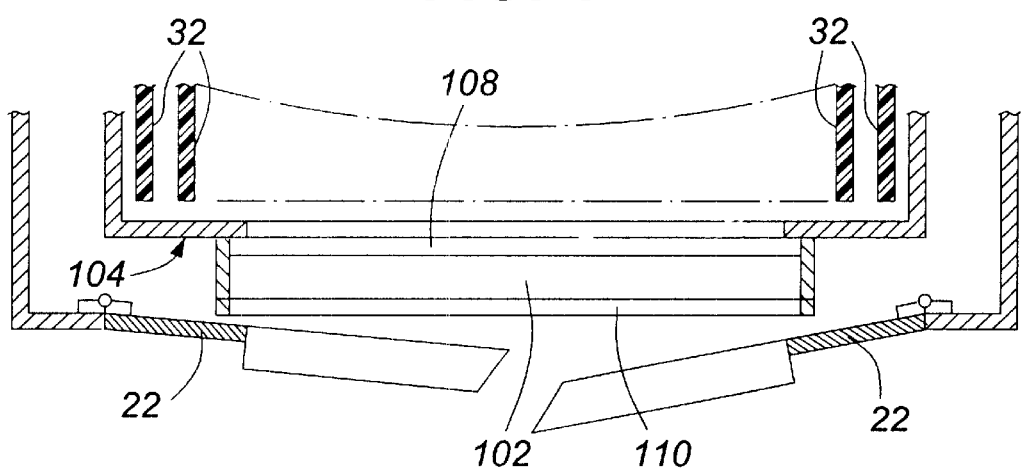
FIG. 10 is a view similar to FIG. 4 of a modification to any of the first, second, third and fifth embodiments.

In the embodiments described above and using at least one conduit 42, each conduit is constructed as described in the first embodiment and has two portions 42a and 42b each carried by an individual door. Such a method of construction is, of course, not essential. As shown by FIG. 10 in a modification of any of the first, second, third and fifth embodiments, a conduit 102 is made of a single construction and has the same outside configuration as the conduit 42, with its portions 42a and 42b assembled together. As shown by FIG. 10, the conduit 102 forms a first part of the cooling passage arrangement and is assembled on to the front wall of an electronic unit 104 in alignment with an entrance to the second part of the passage arrangement within the unit. The conduit is sealed in position to the front wall by a seal 108. Hence the doors 22 move away from the conduit 102 when in their open position (FIG. 10). Each door is provided with part of the inlet 44, as described in the first embodiment, so as to align the inlet with the conduit 102, when the doors are in their closed positions. A seal 110 is provided around the front edge of the conduit 102 to seal against the doors when these are closed.

In each of the described embodiments (except in relation to FIGS. 8 and 9), the units of electronic equipment are shown as being identical. However, in other embodiments, units of different designs may be used as long as they are compatible with the cabinets for input and output of cooling air.

What is claimed is:

1. A combination of a security cabinet and electronic equipment housed within the security cabinet, a cooling air flow passage arrangement for the electronic equipment, and an inlet and an outlet for the cooling air passage arrangement, and in which the inlet opens directly to the exterior of the cabinet to pass cooling air directly from a first spacial region exterior to the cabinet into the air flow passage arrangement, while substantially bypassing a chamber defined between the cabinet and the electronic equipment, to be expelled from the outlet and outwardly of the cabinet to a second spacial region exterior to the cabinet.

2. A combination according to claim 1, wherein the inlet is provided in a wall of the cabinet and a cooling air conduit extends from the inlet, across part of the chamber of the cabinet to the electronic equipment to define a first part of the cooling air passage arrangement interconnected in series to a second part of the arrangement defined within the electronic equipment.

3. A combination according to claim 2, wherein the first part of the cooling air passage arrangement is substantially sealed by the cooling air conduit from the chamber of the cabinet.

4. A combination according to claim 2, wherein the wall of the cabinet comprises a door arrangement and the cooling air inlet is defined by the door arrangement.

5. A combination according to claim 4, wherein the door arrangement comprises two doors which are hinged at remote edges of the door arrangement with the doors having free edges which close together to form the wall, and the cooling air conduit is provided in two portions, the portions mounted, one to each door, to define part of the inlet in each door, and with the two portions having surfaces which, with doors in closed positions, oppose each other to provide the cooling air conduit.

6. A combination according to claim 5, wherein the surfaces of the two portions which oppose each other are inclined relative to the plane of the doors, when these are in closed positions, whereby a first of the doors requires to be closed before closing of a second of the doors, with the inclined surface of the portion of the passage structure carried by the second door moving towards and then substantially sealing against the other inclined surface, as the second door moves towards and into its closed position.

7. A combination according to claim 4, wherein the cooling air conduit is provided on the electronic equipment and extends from the electronic equipment to the inlet, when the door arrangement is in closed condition.

8. A combination according to claim 1, wherein the cooling air passage arrangement has a portion extending beneath the electronic equipment and interconnects with a second portion of the cooling air passage arrangement at an underside of the equipment.

9. A combination according to claim 8, wherein the electronic equipment is a first electronic equipment and a second electronic equipment is provided, the combination also including a further cooling air passage arrangement and an associated inlet and an associated outlet for the further cooling air passage arrangement, the inlet provided in a wall of the cabinet, and a cooling air conduit extends from the associated inlet across part of the chamber of the cabinet to the electronic equipment and defines a first part of the further cooling air passage arrangement interconnected in series with a second and third parts of this arrangement, the second part defined within an upper region of the first electronic equipment and the third part interconnected with the second part in an underside of the second electronic equipment.

10. A combination according to claim 9, wherein the associated inlet is provided by a door arrangement forming a wall of the cabinet.

11. A combination according to claim 1, comprising a cooling air conduit which extends upwardly from the electronic equipment to the inlet which opens directly to the first spacial region located above the cabinet, the conduit defining a first part of the cooling arrangement which is interconnected to a second part of the cooling arrangement defined within the electronic equipment.

12. A combination according to claim 1, wherein the air outlet opens into the chamber of the cabinet and the cabinet has an opening to enable the heated cooling air to pass from the outlet to the second spacial region.

13. A combination according to claim 1, wherein the air outlet opens directly into the second exterior spacial region and the cabinet has an inlet opening for cooling air from a region exteriorly of the combination for flow of further cooling air into the chamber of the cabinet, an outlet opening also being provided for the further cooling air to escape from within the chamber.

14. A method of cooling electronic equipment housed within a security cabinet, comprising moving a stream of cooling air directly from a first spacial region exterior to the cabinet into and through a cooling air passage arrangement of the electronic equipment, while substantially bypassing a chamber defined between a cabinet and the electronic equipment, and passing the stream of cooling air from a cooling air outlet of the equipment and into a second spacial region of the equipment.

15. A method according to claim 14, comprising passing the cooling air through an inlet and into a first part of the cooling air passage arrangement provided by a cooling air conduit extending across part of the chamber of the cabinet to a second part of the passage arrangement defined within the electronic equipment.

16. A method according to claim 14, comprising passing the cooling air through the inlet in a lower portion of a wall of the cabinet, passing the stream of cooling air beneath the underside of the electronic equipment, and then passing the stream upwardly through the underside of the equipment and into the passage arrangement.

* * * * *